: US 7,612,421 B2
(45) Date of Patent: Nov. 3, 2009

(12) United States Patent
Enicks (54) ELECTRONIC DEVICE WITH DOPANT DIFFUSION BARRIER AND TUNABLE WORK FUNCTION AND METHODS OF MAKING SAME (75) Inventor: Darwin G. Enicks, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 320 days.

(21) Appl. No.: 11/248,633

(22) Filed: Oct. 11, 2005

(65) Prior Publication Data

US 2007/0080411 A1 Apr. 12, 2007

(51) Int. Cl.
*H01L 29/43* (2006.01)
(52) U.S. Cl. ............................ 257/407; 257/19; 257/20; 257/E29.128; 257/E29.154; 257/E29.157
(58) Field of Classification Search .................. 257/19, 257/20, 63, 407, E29.128, E29.124, E29.157
See application file for complete search history.

(56) References Cited

U.S. PATENT DOCUMENTS

| 6,127,216 | A | 10/2000 | Yu | 438/238 |
|---|---|---|---|---|
| 6,180,499 | B1 | 1/2001 | Yu | 438/585 |
| 6,373,112 | B1 | 4/2002 | Murthy et al. | 257/407 |
| 6,541,322 | B2 | 4/2003 | Chang | 438/199 |
| 6,596,605 | B2 | 7/2003 | Ha et al. | 438/417 |
| 6,667,525 | B2 | 12/2003 | Rhee et al. | 257/407 |
| 6,838,695 | B2 | 1/2005 | Doris et al. | 257/55 |
| 7,009,279 | B2 * | 3/2006 | Nasu et al. | 257/616 |
| 2002/0072182 | A1 | 6/2002 | Ha et al. | 438/301 |
| 2003/0094633 | A1 * | 5/2003 | Gonzalez et al. | 257/202 |
| 2004/0256699 | A1 * | 12/2004 | Cosnier et al. | 257/616 |
| 2005/0045938 | A1 | 3/2005 | Mutou et al. | 257/310 |
| 2005/0258491 | A1 * | 11/2005 | Bojarczuk et al. | 257/369 |

OTHER PUBLICATIONS

Richard C. Jaeger, Introduction to Microelectronic Fabrication, 2002, vol. V, 97, 159, 222.*
W.C. Lee et al., "Observation of Reduced Boron Penetration and Gate Depletion for Poly-$Si_{0.8}Ge_{0.2}$ Gated PMOS Devices", IEEE, vol. 20, No. 1, Jan. 1999, 3 pgs.

(Continued)

*Primary Examiner*—Davienne Monbleau
*Assistant Examiner*—Eduardo A Rodela
(74) *Attorney, Agent, or Firm*—Schwegman, Lundberg & Woessner P.A.

(57) ABSTRACT

A method of fabricating a semiconductive film stack for use as a polysilicon germanium gate electrode to address problems associated with implant and diffusion of dopants. Achieving a sufficiently high active dopant concentration at a gate-dielectric interface while avoiding gate penetration of dopants such as boron is problematic. A higher gate implant dosage or annealing temperature is needed, and boron penetration through the thin gate oxide is inevitably enhanced. Both problems are exacerbated as the gate dielectric becomes thinner. In order to achieve a high level of active dopant concentration next to the gate dielectric without experiencing problems associated with gate depletion and penetration, a method and procedures of applying a diffusion-blocking layer is described with respect to an exemplary MOSFET application. However, a diffusion-blocking concept is also presented, which is readily amenable to a variety of semiconductor related technologies.

40 Claims, 6 Drawing Sheets

OTHER PUBLICATIONS

E.J. Stewart et al., "Suppression of Boron Penetration in P- Channel MOSFETs Using Polycrystalline $Si_{1-x-y}Ge_xC_y$ Gate Layers", IEEE, vol. 22, No. 12, Dec. 2001, 3 pgs.

B. Yu et al., "Gate Engineering for Deep-Submicron CMOS Transistors", IEEE, vol. 45, No. 6, Jun. 1998, pp. 1253-1262.

Y.V. Ponomarev et al., "High-Performance Deep SubMicron CMOS Technologies with Polycrystalline-SiGe Gates", IEEE, vol. 47, No. 4, Apr. 2000, pp. 848-855.

V. Z-Q. Li et al., "Single Gate 0.15 μm CMOS Devices Fabricated Using RTCVD In-Situ Boron Doped $Si_{1-x}Ge_x$ Gates", IEEE, Electrical and Computer Engineering Dept., No. Carolina State Univ., IEDM 97, pp. 833-836.

\* cited by examiner

DIFFUSION-BLOCKING LAYER DOPANT DEPTH

*Fig._3*

DIFFUSION-BLOCKING LAYER DOPANT DEPTH

*Fig._4*

DIFFUSION-BLOCKING LAYER DOPANT DEPTH

ELECTRONIC DEVICE WITH DOPANT DIFFUSION BARRIER AND TUNABLE WORK FUNCTION AND METHODS OF MAKING SAME

TECHNICAL FIELD

The invention generally relates to methods of fabrication of integrated circuits (ICs). More specifically, the invention is a method of fabricating a metal-oxide-silicon (MOS) gate electrode containing a diffusion-blocking layer made substantially of silicon and germanium.

BACKGROUND ART

Polysilicon germanium (poly-SiGe) is advantageous over polysilicon as a gate electrode material due to its reduced dopant diffusion properties and work function engineering capability. Consequently, poly-SiGe films have gained much attention for design and manufacturing of MOS devices.

Advances in semiconductor manufacturing technology have allowed integration of hundreds of millions of circuit elements, such as transistors, on a single integrated circuit (IC). In order to achieve such increases in density, interconnect line widths become smaller and overall dimensions of metal-oxide-semiconductor field effect transistors (MOSFETs) have decreased. These transistor devices are commonly referred to as FETs, and will thus be so referred to herein.

Transistor scaling typically involves more than just a linear reduction of a width and length of the FET. For example, both source/drain (S/D) junction depth and gate insulator thickness are also typically reduced in order to produce a FET with the desired electrical characteristics. As device geometries continue to scale downward, issues involving dopant diffusion have become a significant engineering challenge. Among these challenges is limiting effects related to gate depletion and dopant penetration of a thin gate dielectric. Gate depletion and dopant penetration lead to device performance issues related to changes in threshold voltage or turn-on voltage of a transistor and also relate to sub-threshold leakage current or inability to completely turn the transistor off. In PMOSFETs, the dopant penetration will shift the threshold voltage from negative to positive, making it difficult or impossible to turn the transistor off. In NMOSFETs, the opposite will occur.

Doped polysilicon is typically used as the gate material of most FET devices. Since doped polysilicon is a semiconductive material, the polysilicon tends to experience formation of a depletion region adjacent to the interface between a gate electrode and a gate insulator (also referred to as the gate dielectric) when a voltage is applied to the gate electrode. Another cause of the depletion region is an inability of ion implantation and subsequent thermal anneal process steps to result in a homogeneously doped layer from top to bottom. As transistor scaling has substantially reduced a thickness of the gate insulator layer, a width of the depletion region in the doped polysilicon gate electrode has come to play a more significant role in determining the electrical characteristics of the FET. Unfortunately, any occurrence of a depletion region in the gate electrode tends to degrade transistor performance.

Transistor scaling has also reduced a thickness of the gate dielectric layer. The gate dielectric layer separates the gate electrode from an underlying substrate or gate channel. A reduction in thickness of the gate dielectric makes the device more sensitive to issues of dopant penetration from the gate electrode across the gate dielectric. The dopant penetration also causes device performance degradation related to changes in both threshold voltage and sub-threshold leakage.

U.S. Pat. No. 6,373,112 to Murthy et al., entitled "Polysilicon-Germanium MOSFET Gate Electrodes," describes an insulated gate field effect transistor (FET) of a particular conductivity type, with a gate electrode including a polycrystalline SiGe layer. Murthy et al. describes a process that includes forming ultra-thin silicon seed film superjacent a gate dielectric layer followed by forming a SiGe layer over the seed layer. The thin Si seed layer enables deposition of the SiGe film to be substantially uniform and continuous without significant gate oxide degradation. The small thickness of the seed layer also enables effective Ge diffusion into the Si seed layer during subsequent deposition and/or subsequent thermal operations, resulting in a homogenous Ge concentration in the seed film and the SiGe overlayer.

Further, the polysilicon germanium gate electrode is gaining attention for MOS transistors due to its material properties of reduced dopant diffusion, enhanced carrier mobility, and tunable work function. As gate dielectric layers are reduced in thickness, the gate capacitance is increased. Therefore, the capacitance due to the gate depletion effect becomes more dominant because it is smaller than the gate capacitance and the two capacitive regions are in series. This is due to the relation for effective capacitance $$C_{eff} = \frac{C_{gate} \cdot C_{depletion}}{C_{gate} + C_{depletion}}$$

To minimize an effect of gate depletion, the dopant distribution should be kept as uniform as possible throughout the layer. Additionally, the dopant should not be allowed to penetrate into the gate dielectric layer.

However, problems of gate depletion and gate penetration are still not completely resolved by the addition of Ge to the polysilicon layer. The gate depletion problem still exists due to inhomogeneous doping throughout the poly layers as a result of an ion implantation profile, as well as the gate penetration problem associated with ion implantation straggle.

Therefore, what is needed is a gate electrode structure that substantially overcomes the problems associated with gate depletion and methods of making such a gate electrode structure.

SUMMARY

An embodiment of the present invention is therefore a method of forming an MOS gate electrode comprising a diffusion-blocking layer made substantially of silicon, germanium, and carbon. The diffusion-blocking layer prevents dopant penetration into or across the gate dielectric and allows in-situ doping of the gate to further prevent depletion effects. The method includes in-situ doping of select portions of the gate stack with various n-type and p-type impurities. The method also includes germanium profile tailoring thus allowing engineering of the work function and the dopant diffusion. A specific exemplary method includes forming a silicon seed layer over a gate dielectric, depositing an in-situ doped polysilicon germanium diffusion-blocking layer containing carbon, followed by deposition and in-situ doping of the main gate layer, and finally depositing a silicon contact layer. The diffusion-blocking layer contains a higher level of germanium than the main layer and the Ge profile in the diffusion-blocking layer is generally that of a trapezoid.

The present invention is also a polysilicon germanium gate electrode fabricated by methods presented herein. An exemplary poly-SiGe gate electrode includes a seed layer and a contact layer made substantially of silicon, with a diffusion-blocking layer deposited adjacent to the seed layer, and with a main layer deposited between the blocking layer and the contact layer. The blocking layer incorporates germanium in a level of between 10% and 100% with a carbon level of between 0.1% and 5%. The main layer contains germanium in a level between 10% and 100%. The diffusion-blocking layer and main layer are doped in-situ with boron.

DETAILED DESCRIPTION

With reference to FIGS. 1A-1E, overall exemplary process steps of a polysilicon germanium gate electrode illustrate diffusion-blocking techniques of the present invention. For simplicity, a single MOS transistor is illustrated with source and drain regions truncated. Formation of the gate electrode will take place upon a gate dielectric film. The gate dielectric film is deposited or otherwise formed upon a substrate. The MOS transistor may be of either a p-type or an n-type conductivity. Further, one skilled in the art will recognize that the exemplary process steps described herein are readily amenable to other processes and types of electronic devices.

Figure 1A:
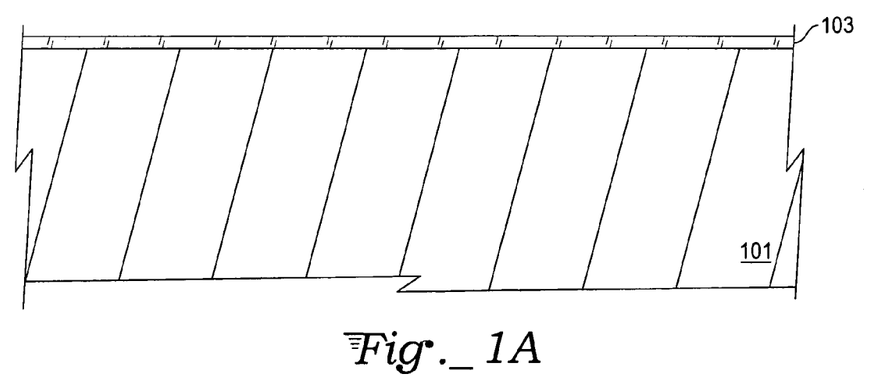
FIGS. 1A-1E show exemplary cross-sections during various stages of fabrication of a polysilicon germanium gate electrode.

FIG. 1A is a cross-section of a MOS capacitor constructed up to the gate dielectric and includes a substrate 101 and a gate dielectric 103. In a specific exemplary embodiment, the substrate 101 is a p-type silicon wafer and the gate dielectric 102 is comprised of silicon dioxide. Alternatively, the substrate 101 could also be, for example, n-type silicon or a compound semiconductor such as silicon germanium of either p-type or n-type conductivity. The substrate 101 may also be silicon-on-insulator (SOI) or silicon germanium-on-insulator. An alternate gate dielectric 103 may substantially comprise hafnium oxide. In other exemplary embodiments, the gate dielectric 103 could also be silicon nitride or silicon oxynitride. Additionally, the gate dielectric 103 could comprise a spin-on glass. A skilled artisan will recognize that many other materials may be substituted for the gate dielectric 103. In a specific exemplary embodiment, the gate dielectric thickness is less than 50 angstroms (Å).

Figure 1B:
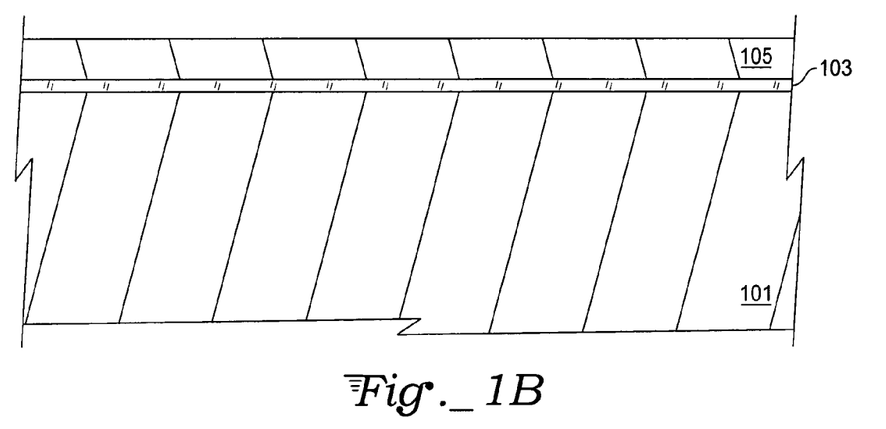

With reference to FIG. 1B, a thin seed layer 105 is formed over the gate dielectric 103. The seed layer 105 serves as both a diffusion-blocking layer and a nucleation layer to prevent germanium diffusion and intermixing with material comprising the gate dielectric material 103, such as silicon dioxide. In one exemplary embodiment, the seed layer 105 is comprised of a thin layer of undoped silicon in a thickness of between 1 nm and 10 nm. Alternatively, the seed layer could be, for example, deposited as an undoped silicon germanium layer. A person skilled in the art will recognize that germanium could also be deposited as the seed layer 105, especially for gate dielectrics other than silicon dioxide. The seed layer 105 may be comprised of polysilicon. However, other film types could be employed such as nanocrystalline, amorphous, or monocrystalline materials. The monocrystalline film type would require a bonding technique similar to that of contemporary silicon-on-insulator technologies. Such bonding techniques are known to a person of skill in the art.

Figure 1C:
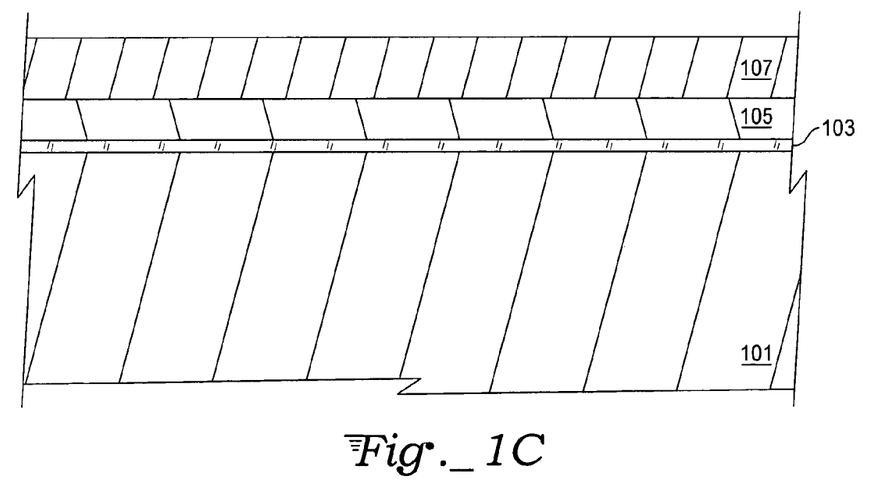

With reference to FIG. 1C, a diffusion-blocking layer 107 is deposited or otherwise formed on top of the seed layer 105. In a specific exemplary embodiment, the diffusion-blocking layer 107 is comprised of polysilicon-germanium-carbon. In this embodiment, the diffusion-blocking layer 107 is doped in-situ with boron for a p-type gate and doped in-situ with phosphorous for an n-type gate. Either the boron or phosphorous may be doped to a level of between $10^{19}$ atoms/cm$^3$ and $10^{21}$ atoms/cm$^3$. In this embodiment, a concentration profile of the germanium is triangular in shape and a thickness of the diffusion-blocking layer 107 is between 1 nm and 50 nm. Concentration profiles are discussed in more depth with reference to FIGS. 3-5, infra. Details of how tailoring of the Ge profile affects the work function is presented with reference with reference to FIGS. 6 and 7, infra. A peak germanium concentration is between 0.1% and 100% while carbon is incorporated to a level of between 0.1% to 5%. Alternatively, the diffusion-blocking layer 107 could be constructed to contain other diffusion limiting impurities such as, for example, nitrogen, fluorine, or oxygen. The Ge concentration profile could be user-selectable to accommodate a final diffusion profile of dopants that is desirable for the particular application, and to achieve a desired work function. One skilled in the art will also recognize that the diffusion-blocking layer 107 could be constructed of Group II-VI or III-V semiconductor compounds such as GaAs, InP, or AlGaAs.

Figure 1D:
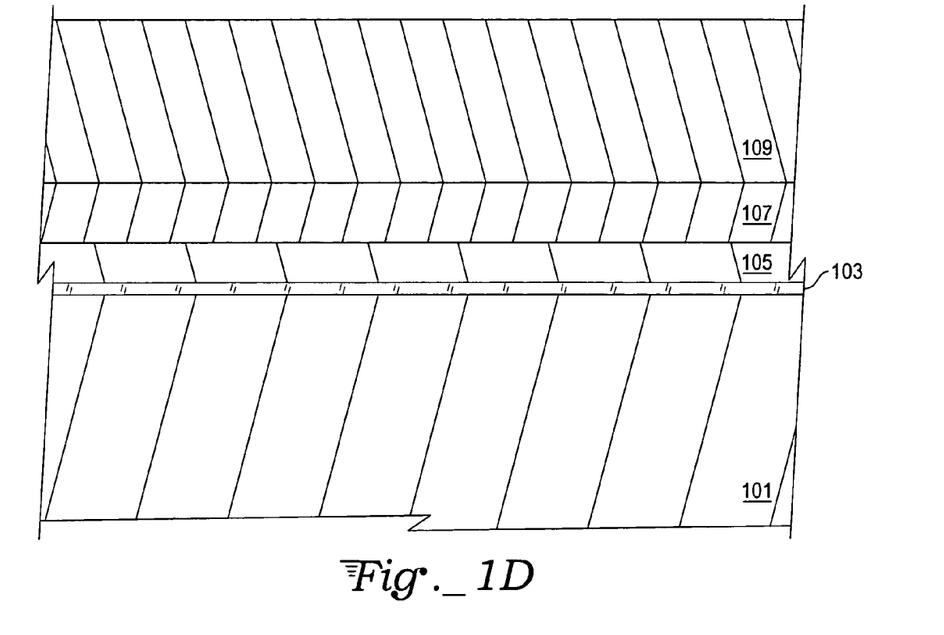

In FIG. 1D, a main layer 109 deposited or otherwise formed on top of the diffusion-blocking layer 107. In a specific exemplary embodiment, the main layer 109 is comprised of polysilicon germanium. The main layer 109 may be doped in-situ with, for example, boron for a p-type gate or doped in-situ with phosphorous for an n-type gate. In this exemplary embodiment, a concentration profile of the germanium is generally box-shaped with a layer thickness between 30 nm and 200 nm. A peak germanium concentration is between 5% and 100%. Alternatively, the main layer 109 could be constructed to contain diffusion limiting impurities such as, for example, carbon, nitrogen, fluorine, or oxygen. The Ge concentration profile could also be user-selectable to accommodate a final diffusion profile of dopants that is desirable for a particular application, and to achieve a desired work function. One skilled in the art will also recognize that the main layer 109 could be constructed of Group II-VI or III-V semiconductor compounds such as GaAs, InP, or AlGaAs. Alternatively, dielectrics such as oxides, nitrides, or oxynitrides may be used to form the main layer 109.

Figure 1E:
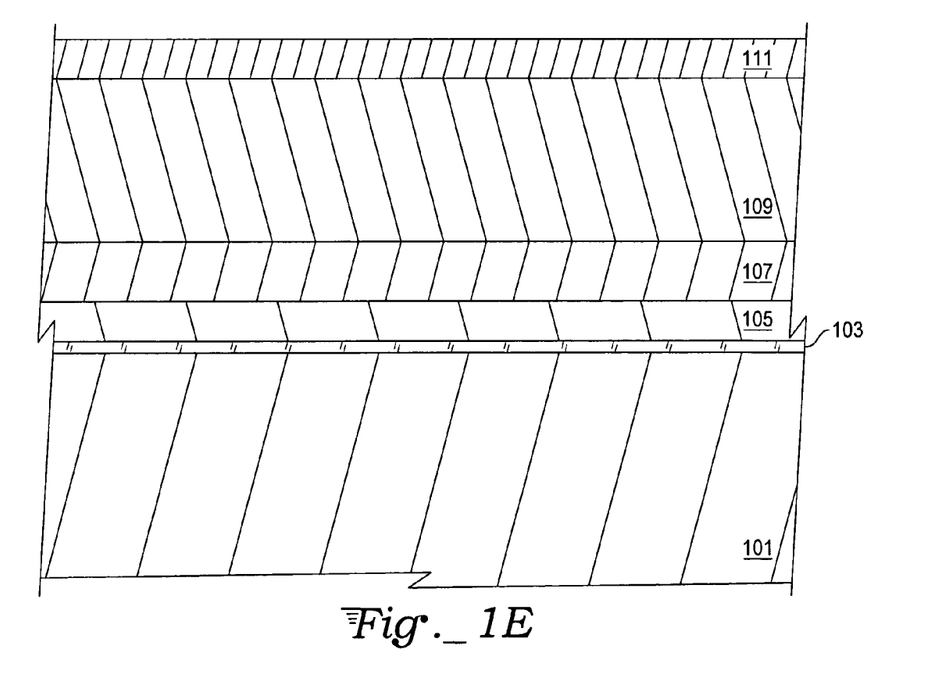

With reference to FIG. 1E, a contact layer 111 is deposited or otherwise formed on top of the main layer 109. In a specific exemplary embodiment, the contact layer 111 is undoped silicon with a thickness of between 5 nm and 50 nm and serves as a sacrificial layer for silicide formation for conduction to the metal contact. Alternatively, the contact layer 111 may be constructed of undoped silicon germanium depending on the silicidation requirements for the particular metal selected as the contact material, with a Ge content of between 5% and 100%. Also, the contact layer 111 could be constructed of other Group II-VI or III-V semiconductors such as, for example, GaAs, InP, or AlGaAs.

Although the main layer 109 and diffusion-blocking layer 107 are doped in-situ during film growth, one skilled in the art will recognize that supplemental doping may also be performed by processes such as ion implantation to achieve a desired conductivity of the layers, and that other doping techniques could be used such as diffusion and plasma-enhanced doping techniques. Also, one skilled in the art will recognize that the seed layer 105 and the contact layer 111 are only necessary where concerns of adjacent material integrity are at stake.

With reference to FIGS. 2A-2D, additional exemplary embodiments of cross-sections employed in fabrication of a polysilicon germanium gate electrode illustrate additional diffusion-blocking techniques of the present invention. The additional embodiments are provided as exemplars only and are not meant to be exhaustive. For simplicity, a single MOS transistor is illustrated with source and drain regions truncated. Further, film layers of FIGS. 2A-2D having numbers similar to film layers of FIGS. 1A-1E are comprised of same or similar films and thicknesses to exemplary types and ranges described supra.

Figure 2A:
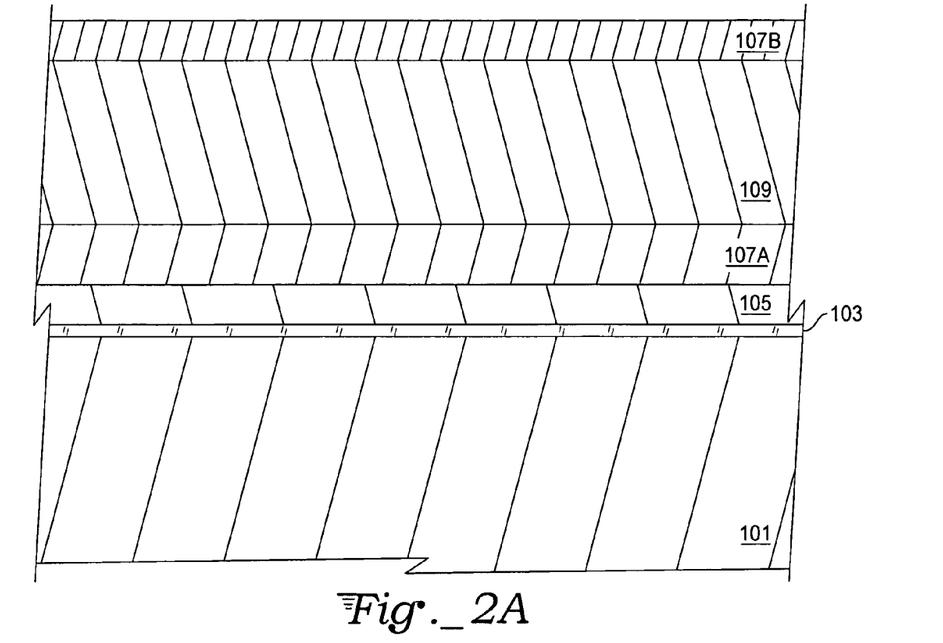
FIGS. 2A-2D show additional exemplary embodiments of cross-sections during various stages of fabrication of a polysilicon germanium gate electrode.

In FIG. 2A, a film stack is fabricated that is similar to that described with reference to FIG. 1D. However, subsequent to a first diffusion-blocking layer 107A being formed, the main layer 109 is formed followed by an additional diffusion-blocking layer 107B being formed. The two diffusion-blocking layers 107A, 107B thus sandwich the main layer 109. Each of the two diffusion-blocking layers 107A, 107B may be comprised of a same material or may each be comprised of different materials having similar diffusion-blocking characteristics to each other. Further, each of the two diffusion-blocking layers 107A, 107B may have either similar or different thicknesses with respect to each other.

Figure 2B:
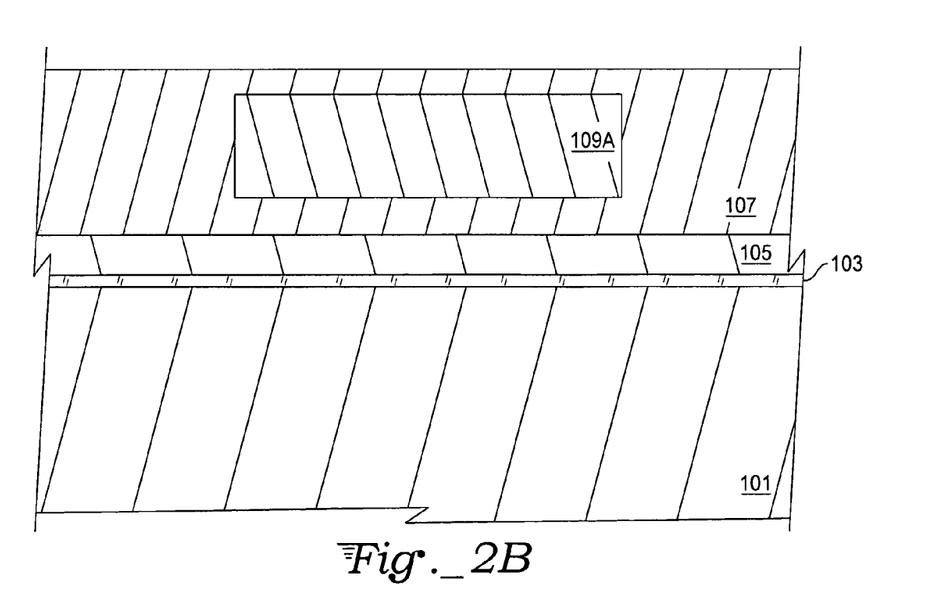

FIG. 2B includes a film stack similar to beginning processes of FIG. 1D. However, after the diffusion-blocking layer 107 is deposited or otherwise formed, a main layer portion 109A is formed over a portion of the diffusion-blocking layer 107 through masking techniques known in the art. After masks (not shown) used to position the main layer portion 109A are removed, an additional formation of the diffusion-blocking layer 107 is continued surrounding and over the main layer portion 109A; thus the diffusion-blocking layer 107 completely surrounds the main layer portion 109A.

This type of film structure is useful for novel electronic devices in which depletion effects may occur on multiple sides or where there are multiple gate-dielectric boundaries. Additionally, any electronic device in which is desirable to prevent dopant penetration into the surrounding dielectric material may benefit from this film structure (the dielectric here is an insulator not used for gate/channel interaction). For instance, photonic devices, which utilize polysilicon and/or polySiGe and/or polySiGeC materials, in uses such as for waveguides, would find merit in this technique to prevent dopant diffusion into or out/of the waveguide boundaries.

Figure 2C:
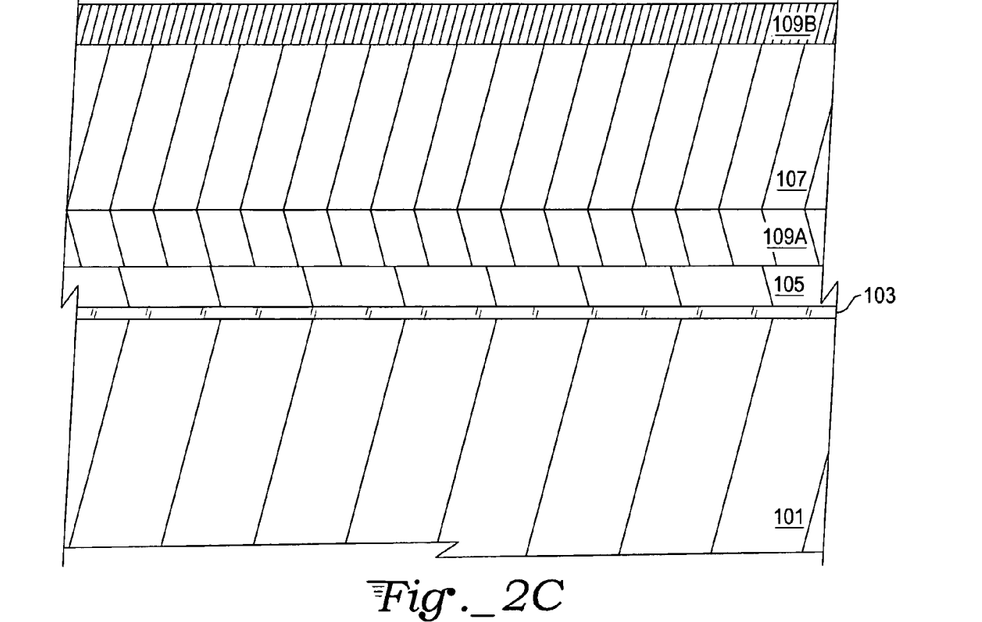

With reference to FIG. 2C, a film stack is fabricated wherein subsequent to a first main layer 109A being formed, the diffusion-blocking layer 107 is formed followed by an additional main layer 109B being formed. The two main layers 109A, 109B thus sandwich the diffusion-blocking layer 107. Each of the two main layers 109A, 109B may be comprised of a same material or each may be comprised of different materials having similar diffusion-blocking characteristics to each other. Further, each of the two main layers 109A, 109B may have either similar or different thicknesses with respect to each other.

Figure 2D:
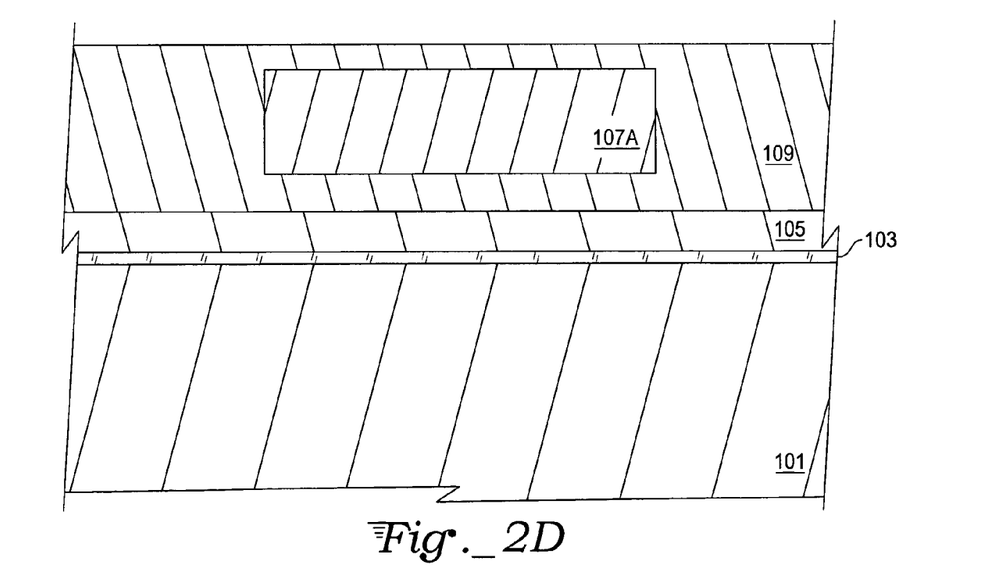

FIG. 2D includes a film stack wherein, after the main layer 109 is deposited or otherwise formed, a diffusion-blocking layer portion 107A is formed over part of the main layer 109 through masking techniques known in the art. After masks (not shown) used to position the diffusion-blocking layer portion 107A are removed, an additional formation of the main layer 109 is continued surrounding and over the diffusion-blocking layer portion 107A, thus the main layer 109 completely surrounds the diffusion-blocking layer portion 107A. This type of film structure is useful for devices such as photonic devices which utilize polysilicon and/or polySiGe and/or polySiGeC materials. Specifically, photonic waveguides would find merit in this technique to prevent dopant diffusion into or out/of the waveguide boundaries.

Figure 3:
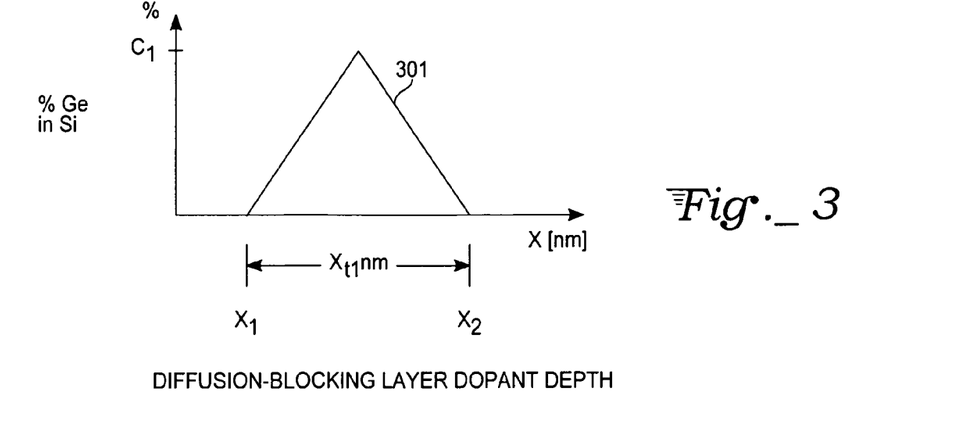
FIG. 3 is a triangular concentration curve of germanium in the diffusion-blocking layer of the polysilicon germanium gate electrode.

With reference to FIG. 3, a triangular germanium concentration profile 301 of an FET device in a particular embodiment indicates an exemplary maximum diffusion-blocking layer dopant depth, $x_{t1}$, of between 1 nm and 50 nm. The concentration of germanium in the approximate center of the diffusion-blocking layer where it reaches its maximum, $C_1$, is between 0.1% and 100%. The triangular germanium concentration profile 301 allows very high early currents. Moreover, the concentration profile 301 permits impressing a drift field for reducing a base transit time of the minority carrier.

Figure 4:
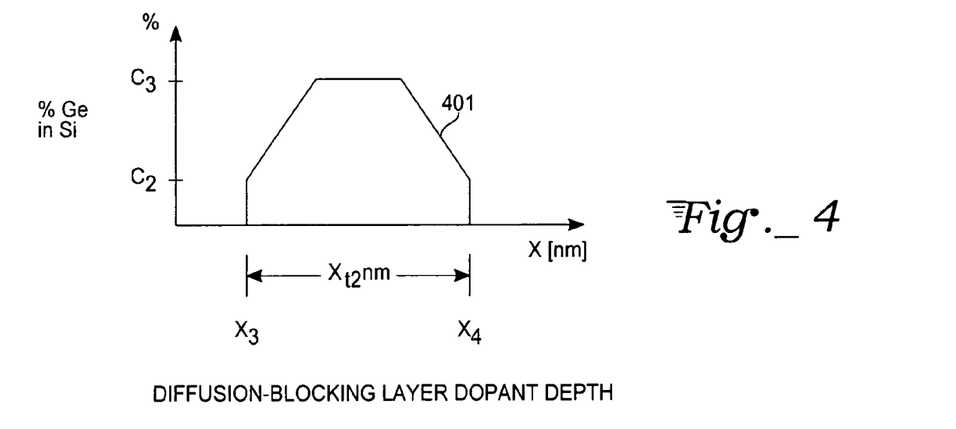
FIG. 4 is a trapezoidal concentration curve of germanium in the diffusion-blocking layer of the polysilicon germanium gate electrode.

An FET device with a trapezoidal germanium concentration profile 401 of FIG. 4 has an exemplary diffusion-blocking layer dopant depth, $x_{t2}$, of between approximately 1 nm and 50 nm. The concentration of germanium in the base layer increases linearly from a side of the collector or emitter of the transistor from about 5% at level $C_2$ to about 100% at $C_3$. In this exemplary embodiment, high current amplification as well as high early current and a drift field are attained, thus reducing a transit time of the base.

Figure 5:
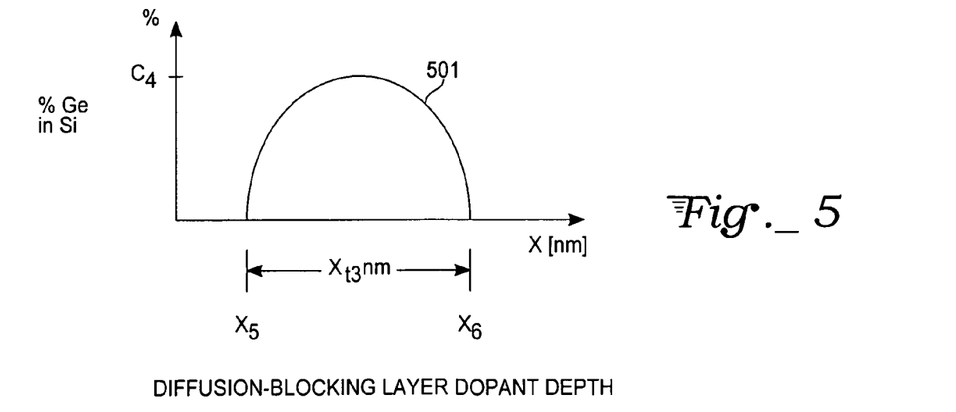
FIG. 5 is a semicircular concentration curve of germanium in the diffusion-blocking layer of the polysilicon germanium gate electrode.

A semicircular concentration profile 501 of FIG. 5 has an exemplary diffusion-blocking layer dopant depth, $x_{t3}$, of between approximately 1 nm and 50 nm. The concentration of germanium increases in, for example, a semicircular or parabolic manner to a maximum concentration as high as 100% at $C_4$. One skilled in the art will recognize that other germanium concentrations are possible as well.

Figure 6:
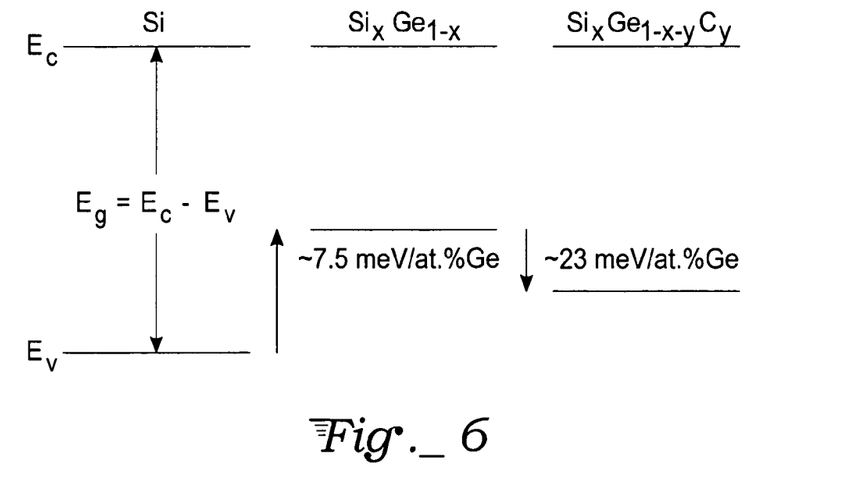
FIG. 6 shows exemplary conduction and valence bands for silicon, silicon germanium, and silicon germanium carbon.

Work function tailoring of the polysilicon gate electrode is realized by the addition of Ge. The difference in bandgap between Si (1.11 eV) and Ge (0.67 eV) occurs mostly in the valence band. Therefore, the bandgap can be tailored by blending Ge with the silicon lattice. FIG. 6 illustrates the valence band lifting with the addition of Ge and also the lowering effect with an addition of carbon. Carbon tends to offset the valence band lifting effect to Ge. However, carbon is typically added in far lower concentrations than Ge so the net effect, even with the addition of carbon, is a significant bandgap reduction due to the valence band lifting accomplished with Ge incorporation.

Figure 7:
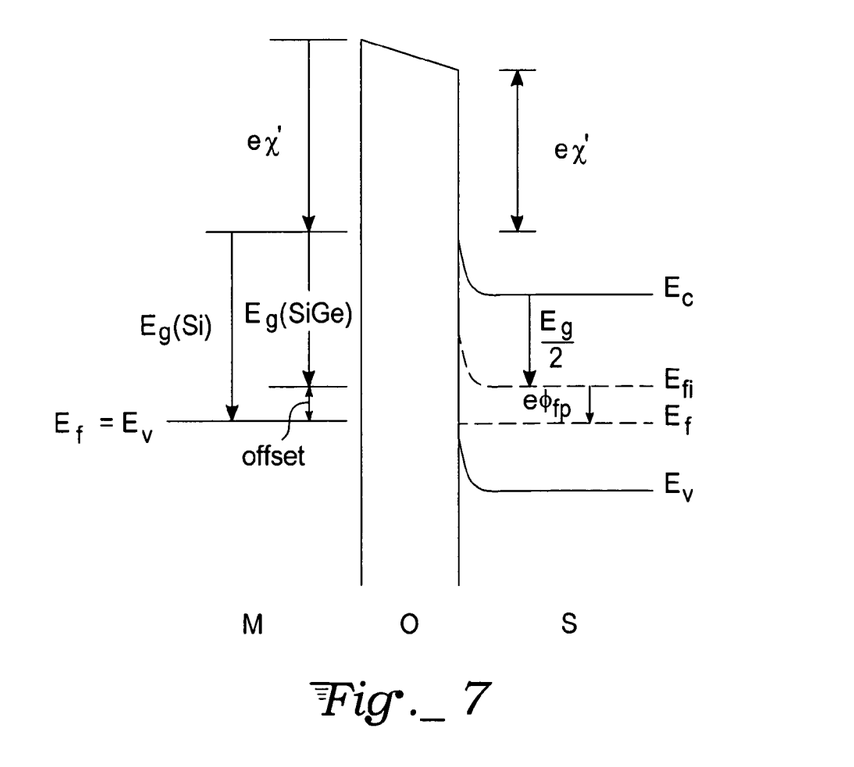
FIG. 7 shows an MOS energy band illustrating an exemplary bandgap reduction primarily in the valence band of the polySiGe gate.

The lifting of the valence band energy is a significant effect, especially for p+ polysilicon gates with Ge incorporated. The energy band diagram of FIG. 7 illustrates how Ge effectively alters the gate-semiconductor work function in degenerately doped p+ polySiGe gate electrodes in an MOS device. This exemplary embodiment is with a p-type substrate, although an n-type substrate would also work just as well.

The general formula for a metal-semiconductor work function difference for a p+ polysilicon gate on a p-type substrate can be written as $$\phi ms = [\phi m' - (\chi' = Eg/2e + \phi fp)]$$

where $\phi m'$ is the modified metal work function, and $\phi m'=\chi'+E_g/e$ (modified work function for poly gate); where $\chi'$ is the electron affinity for the poly gate material.

The electron affinity for silicon is slightly greater than the electron affinity for germanium. Since the addition of Ge significantly raises the valence band of the p+ poly gate electrode and slightly reduces electron affinity, the result is that $\phi m'$ is reduced according to the amount of Ge incorporated with silicon. Since $\phi m'$ is reduced, the gate-semiconductor work function, $\phi ms$, is also reduced. A result is that the threshold voltage, for instance of a PMOSFET device, becomes more negative, thus allowing significant tailoring of threshold voltage via implants, oxide thickness, and/or channel doping, thus providing an additional degree of freedom for device performance tailoring.

Although the present invention is described in terms of exemplary embodiments, a skilled artisan will realize that techniques described herein can readily be adapted to other forms of fabrication techniques and devices. For example, the diffusion-blocking concept could be applied to other technologies such as FINFET, surround gate FET, hyper-abrupt junctions, and optical waveguides for photonics. Therefore, a position of the diffusion-blocking layer 107 can be selected to accommodate a variety of needs. The diffusion-blocking layer 107 could also be constructed of other materials, which have a greatly diminished diffusivity for a given dopant type. Such materials include, for example, silicon dioxide, silicon-nitride, or silicon-oxynitride. Therefore, the diffusion-blocking layer 107 should not be constrained to a particular impurity, but can encompass a variety of diffusion-limiting impurities and to a variety of material types that exhibit low accommodation for diffusion of particular types of atoms and molecules.

Also, although process steps and techniques are shown and described in detail, a skilled artisan will recognize that other techniques and methods may be utilized, which are still included within a scope of the appended claims. For example, there are several techniques used for depositing and doping a film layer (e.g., chemical vapor deposition, plasma-enhanced chemical vapor deposition, molecular beam epitaxy, atomic layer deposition, etc.). Although not all techniques are amenable to all film types described herein, one skilled in the art will recognize that multiple and alternative methods may be utilized for depositing a given layer and/or film type.

Additionally, many industries allied with the semiconductor industry could make use of the diffusion-blocking technique. For example, a thin-film head (TFH) process in the data storage industry or an active matrix liquid crystal display (AMLCD) in the flat panel display industry could readily make use of the processes and techniques described herein. The term "semiconductor" should thus be recognized as including the aforementioned and related industries. The specification and drawings are, accordingly, to be regarded in an illustrative rather than a restrictive sense.

What is claimed is:

1. An electronic device comprising:
   a substrate;
   a gate dielectric layer disposed over at least a portion of the substrate;
   at least one diffusion-blocking layer disposed over at least a portion of the gate dielectric layer, comprised substantially of a first compound semiconductor and including:
      an alterable diffusion limiting property which is alterable by doping the first compound semiconductor with one or more diffusion-limiting impurities; and
      a first tunable work function which is tunable by doping the first compound semiconductor with one or more additional semiconducting elements or semiconducting compounds; and
   at least one main layer comprised substantially of a second compound semiconductor having a second tunable work function, wherein the at least one main layer substantially surrounds the at least one diffusion-blocking layer.

2. The electronic device of claim 1 wherein the first compound semiconductor is comprised substantially of silicon germanium.

3. The electronic device of claim 1 wherein the second compound semiconductor is comprised substantially of silicon germanium.

4. The electronic device of claim 1 wherein between 5% and 100% germanium is incorporated into the at least one diffusion-blocking layer.

5. The electronic device of claim 1, wherein the at least one diffusion-blocking layer contains a higher level of germanium than the at least one main layer.

6. The electronic device of claim 1, wherein between 0.1% and 5% carbon is incorporated into the at least one diffusion-blocking layer.

7. The electronic device of claim 1, wherein the one or more diffusion-limiting impurities are selected from oxygen, fluorine, nitrogen, and combinations thereof.

8. The electronic device of claim 7, wherein between 0.1% and 10% diffusion-limiting impurities are incorporated into the at least one diffusion-blocking layer.

9. The electronic device of claim 1, wherein the at least one diffusion-blocking layer is polycrystalline.

10. The electronic device of claim 1, wherein the at least one diffusion-blocking layer is amorphous.

11. The electronic device of claim 1, the at least one diffusion-blocking layer has a p-type conductivity.

12. The electronic device of claim 1, wherein the at least one diffusion-blocking layer has an n-type conductivity.

13. The electronic device of claim 1, wherein the at least one diffusion-blocking layer further comprises boron, phosphorous, or combinations thereof, in a concentration between $10^{19}$ atoms/cm$^3$ and $10^{21}$ atoms/cm$^3$.

14. The electronic device of claim 1 further comprising a liquid crystal display or data storage coupled thereto.

15. An electronic device comprising:
   a substrate;
   a gate dielectric layer disposed over at least a portion of the substrate;
   at least one diffusion-blocking layer disposed over at least a portion of the gate dielectric layer, comprised substantially of a first compound semiconductor and including:
      an alterable diffusion limiting property which is alterable by doping the first compound semiconductor with one or more diffusion-limiting impurities; and
      a first tunable work function which is tunable by doping the first compound semiconductor with one or more additional semiconducting elements or semiconducting compounds; and
   at least one main layer is substantially surrounded by the at least one diffusion-blocking layer and comprised substantially of a second compound semiconductor having a second tunable work function.

16. The electronic device of claim 15 comprising two main layers, wherein a second main layer is located above the at least one diffusion-blocking layer.

17. The electronic device of claim 15 comprising two diffusion-blocking layers, wherein the at least one main layer is located in between the two diffusion-blocking layers.

18. The electronic device of claim 15 wherein the first compound semiconductor is comprised substantially of silicon germanium.

19. The electronic device of claim 15 wherein the second compound semiconductor is comprised substantially of silicon germanium.

20. The electronic device of claim 15 wherein between 5% and 100% germanium is incorporated into the at least one diffusion-blocking layer.

21. The electronic device of claim 15, wherein the at least one diffusion-blocking layer contains a higher level of germanium than the at least one main layer.

22. The electronic device of claim 15, wherein between 0.1% and 5% carbon is incorporated into the at least one diffusion-blocking layer.

23. The electronic device of claim 15, wherein the one or more diffusion-limiting impurities are selected from oxygen, fluorine, nitrogen, and combinations thereof.

24. The electronic device of claim 23, wherein between 0.1% and 10% diffusion-limiting impurities are incorporated into the at least one diffusion-blocking layer.

25. The electronic device of claim 15, wherein the at least one diffusion-blocking layer is polycrystalline.

26. The electronic device of claim 15, wherein the at least one diffusion-blocking layer is amorphous.

27. The electronic device of claim 15, the at least one diffusion-blocking layer has a p-type conductivity.

28. The electronic device of claim 15, wherein the at least one diffusion-blocking layer has an n-type conductivity.

29. The electronic device of claim 15, wherein the at least one diffusion-blocking layer further comprises boron, phosphorous, or combinations thereof, in a concentration between $10^{19}$ atoms/cm$^3$ and $10^{21}$ atoms/cm$^3$.

30. An integrated circuit structure comprising:
a substrate;
a gate dielectric layer disposed over at least a portion of the substrate;
at least one monocrystalline diffusion-blocking layer disposed over at least a portion of the gate dielectric layer, comprised substantially of a first compound semiconductor and including:
an alterable diffusion limiting property which is alterable by doping the first compound semiconductor with one or more diffusion-limiting impurities; and
a first tunable work function which is tunable by doping the first compound semiconductor with one or more additional semiconducting elements or semiconducting compounds; and
at least one main layer either substantially surrounded by the at least one monocrystalline diffusion-blocking layer or surrounding the at least one monocrystalline diffusion-blocking layer and comprised substantially of a second compound semiconductor having a second tunable work function.

31. The integrated circuit structure of claim 30 wherein the first compound semiconductor is comprised substantially of silicon germanium.

32. The integrated circuit structure of claim 30 wherein the second compound semiconductor is comprised substantially of silicon germanium.

33. The integrated circuit structure of claim 30 wherein between 5% and 100% germanium is incorporated into the at least one monocrystalline diffusion-blocking layer.

34. A method of forming an electronic device comprising:
providing a substrate;
forming a gate dielectric layer over at least a portion of the substrate;
forming at least one diffusion-blocking layer disposed over at least a portion of the gate dielectric layer, comprised substantially of a first compound semiconductor having:
an alterable diffusion limiting property which is alterable by doping the first compound semiconductor with one or more diffusion-limiting impurities; and
a first tunable work function which is tunable by doping the first compound semiconductor with one or more additional semiconducting elements or semiconducting compounds; and
forming at least one main layer between the gate dielectric layer and the at least one diffusion-blocking layer, the at least one main layer comprised substantially of a second compound semiconductor having a second tunable work function, wherein the at least one diffusion-blocking layer surrounds the at least one main layer.

35. The method of claim 34 further comprising in-situ doping of the first and second compound semiconductors.

36. The method of claim 34 further comprising incorporating arsenic into the at least one diffusion-blocking layer at a concentration of between $10^{19}$ atoms/cm$^3$ and $10^{21}$ atoms/cm$^3$.

37. The method of claim 34 further comprising incorporating germanium into the at least one diffusion-blocking layer in a trapezoidal concentration profile, a triangular concentration profile, a box-shape concentration profile, or a semicircular concentration profile.

38. The method of claim 34 wherein the at least one main layer is comprised substantially of silicon germanium.

39. The method of claim 38 wherein the concentration of germanium in the at least one main layer is less than a concentration of germanium in the at least one diffusion-blocking layer.

40. A product formed according to the method of claim 34.

* * * * *

UNITED STATES PATENT AND TRADEMARK OFFICE
CERTIFICATE OF CORRECTION

| | | |
|---|---|---|
| PATENT NO. | : 7,612,421 B2 | Page 1 of 1 |
| APPLICATION NO. | : 11/248633 | |
| DATED | : November 3, 2009 | |
| INVENTOR(S) | : Darwin G. Enicks | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 502 days.

Signed and Sealed this

Nineteenth Day of October, 2010

David J. Kappos
*Director of the United States Patent and Trademark Office*